(12) United States Patent
Jung et al.

(10) Patent No.: US 9,054,605 B2
(45) Date of Patent: Jun. 9, 2015

(54) HAPTIC MODULE USING PIEZOELECTRIC ELEMENT

(75) Inventors: He Won Jung, Ansan-si (KR); Jong Sik Seo, Ansan-si (KR); Min Gi Kim, Ansan-si (KR); Se Jun Chun, Ansan-si (KR)

(73) Assignee: HYSONIC. CO., LTD. (KR)

( * ) Notice: Subject to any disclaimer, the term of this patent is extended or adjusted under 35 U.S.C. 154(b) by 173 days.

(21) Appl. No.: 13/881,923

(22) PCT Filed: Nov. 7, 2011

(86) PCT No.: PCT/KR2011/008416
§ 371 (c)(1),
(2), (4) Date: Apr. 26, 2013

(87) PCT Pub. No.: WO2012/067370
PCT Pub. Date: May 24, 2012

(65) Prior Publication Data
US 2013/0229088 A1 Sep. 5, 2013

(30) Foreign Application Priority Data

Nov. 19, 2010 (KR) .................. 10-2010-0115830
Mar. 31, 2011 (KR) .................. 10-2011-0029716
Apr. 18, 2011 (KR) .................. 10-2011-0035755

(51) Int. Cl.
*H01L 41/053* (2006.01)
*H02N 2/02* (2006.01)
(Continued)

(52) U.S. Cl.
CPC ............... *H02N 2/026* (2013.01); *G06F 3/016* (2013.01); *G06F 3/041* (2013.01); *H01L 41/0973* (2013.01); *H02N 2/001* (2013.01); *H02N 2/06* (2013.01); *G06F 2203/04103* (2013.01)

(58) Field of Classification Search
CPC ........ A45F 5/02; A45F 5/021; H01M 2/1055; H01L 41/0926; H01L 41/053; H01L 41/38; H03H 9/0514; H03H 9/0547; H03H 9/0135; H04M 19/04; H02K 7/061; H04W 88/027
USPC .......................... 310/338, 348, 328, 330–332; 340/407.1, 407.2, 7.6, 7.63
See application file for complete search history.

(56) References Cited

U.S. PATENT DOCUMENTS 5,229,744 A * 7/1993 Ogura ............................. 340/7.6
6,888,947 B2 * 5/2005 Takeshima et al. ........... 381/190
(Continued)

FOREIGN PATENT DOCUMENTS

EP      2202622 A1 *   6/2013   ............. G06F 3/041
JP      2004094389      3/2004
(Continued)

OTHER PUBLICATIONS

International Search Report—PCT/KR2011/008416 dated Jul. 31, 2012.

*Primary Examiner* — Thomas Dougherty
(74) *Attorney, Agent, or Firm* — Cantor Colburn LLP

(57) ABSTRACT

Disclosed is a haptic module using a piezoelectric element. The haptic module comprises a base, a vibration member which is mounted on the upper portion of the base so as to be vertically movable, a piezoelectric element which couples to the vibration member, a power portion for applying power to the piezoelectric element, and a panel member which is mounted to the upper portion of the vibration member. According to the present invention, vertical movement of the vibration member effectively sends force to the panel member by means of the piezoelectric element to facilitate the vertical movement and enhance driving force, and thereby enhances the feeling of vibration or clicking of the panel member.

15 Claims, 10 Drawing Sheets

(51) Int. Cl.
  *G06F 3/01* (2006.01)
  *G06F 3/041* (2006.01)
  *H02N 2/00* (2006.01)
  *H02N 2/06* (2006.01)
  *H01L 41/09* (2006.01)

(56) References Cited

U.S. PATENT DOCUMENTS

| | | | | |
|---|---|---|---|---|
| 7,215,329 B2* | 5/2007 | Yoshikawa et al. | | 345/173 |
| 7,579,758 B2* | 8/2009 | Maruyama et al. | | 310/348 |
| 7,663,604 B2 | 2/2010 | Maruyama et al. | | |
| 7,671,517 B2* | 3/2010 | Ishimasa et al. | | 310/353 |
| 7,999,660 B2* | 8/2011 | Cybart et al. | | 340/407.2 |
| 8,179,027 B2 | 5/2012 | Strittmatter et al. | | |
| 8,279,623 B2* | 10/2012 | Idzik et al. | | 361/814 |
| 8,466,604 B2* | 6/2013 | Woo et al. | | 310/328 |
| 2010/0253485 A1 | 10/2010 | Park et al. | | |
| 2011/0032091 A1* | 2/2011 | Park et al. | | 340/407.2 |
| 2011/0260843 A1* | 10/2011 | Woo et al. | | 340/407.2 |
| 2012/0026103 A1* | 2/2012 | Woo et al. | | 345/173 |

FOREIGN PATENT DOCUMENTS

| | | |
|---|---|---|
| KR | 1020100074034 | 7/2010 |
| KR | 1020100110569 | 10/2010 |
| KR | 1020110039118 | 4/2011 |

* cited by examiner

A-A

B-B

HAPTIC MODULE USING PIEZOELECTRIC ELEMENT

TECHNICAL FIELD

The present invention relates to a haptic module using a piezoelectric element.

BACKGROUND ART

In a recent interface device, forced or contacted feedback called haptic feedback is provided to a user. A haptic version of, for example, a joystick, a mouse, a game pad, a steering wheel, or other devices can output force to a user on the basis of an interaction or an event occurred in a graphic environment of a game or other application programs.

Meanwhile, a touch pad which is formed into a small square shape and provided at a mobile terminal can sense a position of a pointing object with various sensing techniques, such as a capacitive sensor and a pressure sensor, which sense a pressure applied thereon.

The haptic feedback is also provided at the touch pad of the mobile terminal.

FIG. 15 shows the structure of a conventional mobile terminal with a haptic feedback function disclosed in Korean Patent Laid-Open Publication No. 10-2001-0108361. As shown in FIG. 15, a touch pad 16 is elastically installed through a spring 62 at a housing (not shown) of a mobile terminal. A piezoelectric actuator 64 is disposed at a lower side of the touch pad 16. The piezoelectric actuator 64 is comprised of a vibration member (not shown) and a piezoelectric device (not shown) which is coupled to the vibration member. One portion 66 of the piezoelectric actuator 64 is coupled to the touch pad 16, and the other portion 68 thereof is coupled with a weight 70. And when the one portion 66 is moved with respect to the other portion 68, the weight 70 is moved together with the other portion 68. The weight 70 is moved approximately along a z-axis. Since the weight 70 is coupled to the housing, it can be moved freely.

The movement of the weight 70 along the z-axis causes inertial force transmitted to the touch pad 16 through the piezoelectric actuator 64, and the touch pad 16 is moved along the z-axis due to the elastic coupling. The movement of the touch pad 16 is sensed as a haptic sensation by a user contacted with the touch pad 16.

However, in a conventional haptic actuator 64, since the haptic feedback is embodied by only the inertial force of the weight 70, there is a problem in that the sensitivity of haptic feedback is deteriorated due to its weak up/down moving force.

FIG. 16 is a graph showing waveforms of a voltage and a current applied to a conventional piezoelectric device. As shown in FIG. 16, a square wave voltage is applied to a conventional piezoelectric device. In the square wave voltage, a momentary voltage is sharply increased. In FIG. 2, an input maximum voltage is 75V, and an output maximum current is 150 mA. Herein, a power consumption is expressed as $P=V \times I$, and thus a momentary power consumption is $75V \times 0.15 A=$ about 11.25 W.

As described above, in the prior art, since the square wave voltage which is sharply increased is applied to the piezoelectric device, the vibration member and a panel part are suddenly vibrated and noise is generated. Further, since a slope of the input voltage is large, there is another problem that the momentary power consumption is also large.

DISCLOSURE

Technical Problem

An object of the present invention is to provide a haptic module which can stably increase the up/down moving force and also can enhance the sensitivity of haptic feedback.

Further, another object of the present invention is to a haptic module which applies a sine wave voltage to a piezoelectric device, thereby preventing generation of noise due to a sudden vibration of the vibration member, and also makes a slope of an input voltage gentle, thereby reducing the momentary power consumption and improving click feeling.

Technical Solution

To achieve the object of the present invention, the present invention can provide a haptic module using a piezoelectric element, comprising a base; a vibration member which is mounted to an upper portion of the base so as to be movable up and down; a piezoelectric element which is coupled to the vibration member; a power part for applying power to the piezoelectric element; and a panel member which is mounted to an upper portion of the vibration member, wherein the piezoelectric element deforms the vibration member to be bent and vibrates the panel member up and down.

In the first embodiment of the present invention, the haptic module further comprises an elastic supporting part formed into a bar shape of which one end is connected with one of the base and the vibration member and the other end is connected with the other one, wherein the piezoelectric element is installed at the elastic supporting part so as to deform the vibration member to be bent and vibrate the panel member up and down when electric power is applied, and the elastic supporting part is formed to be inclined from one end thereof toward the other end, and in a normal state, an up and down distance between the one end of the elastic supporting part and the other end thereof is formed to be larger than an up and down distance between the vibration member and the base, thereby elastically supporting the vibration member upward.

In the first embodiment of the present invention, one end of the elastic supporting part is integrally connected with the vibration member and the other end thereof is formed to be inclined downward and settled on the upper portion of the base, and the vibration member is formed with a spacing hole which is formed to be opened up and down and which allows an outer surface of the elastic supporting part to be spaced apart from the vibration member.

In the first embodiment of the present invention, the piezoelectric element is installed at a lower side of the elastic supporting part, and a GND electrode is installed at an upper surface of the piezoelectric device, which is between the piezoelectric element and the elastic supporting part, and a positive (+) electrode is installed at a lower surface of the piezoelectric element, and if electric power is applied to the piezoelectric element through the GND electrode and the positive (+) electrode, the piezoelectric element is contracted or expanded in a length direction thereof, and thus the elastic supporting part is deformed to be bent upward and downward, and the base is formed with a groove which is formed to be opened up and down and disposed at a lower side of the elastic supporting part so that the piezoelectric element is inserted into the groove when the elastic supporting part is deformed to be bent, and a width of the groove is formed to be larger than a width of the piezoelectric device in a direction orthogonal to a length direction of the elastic supporting part.

In the first embodiment of the present invention, the elastic supporting part is provided in plural each of which is disposed at an outer side of the vibration member, and each elastic supporting part has the same length.

In the first embodiment of the present invention, a cushion member is formed along an outer surface of the touch pad between a mobile terminal cover and the vibration member.

In the second embodiment of the present invention, the vibration member comprises a coupling part which is coupled to the panel member; a first supporting part of which one end is connected with the coupling part and the other end is horizontally protruded from the coupling part; and a second supporting part which is horizontally protruded from the coupling part to be parallel with the first supporting part and of which a distal end is bent and fixed to the base, wherein the piezoelectric element is installed at the first supporting part and deforms the first supporting part to be bent and vibrates the panel member up and down, when electric power is applied.

In the second embodiment of the present invention, the second supporting part supports the coupling part and the panel member upward and downward, and comprises an upper supporting part of which one end is connected to the coupling part and the other end is formed to be horizontally protruded; a lower supporting part which is disposed at a lower side of the upper supporting part so as to be spaced apart from the upper supporting part and of which one end is fixed to the base; and a bent part which is formed to be bent and of which one end is connected with the other end of the upper supporting part and the other end is connected with the other end of the lower supporting part.

In the second embodiment of the present invention, the first and second supporting parts are spaced apart from a lower surface of the panel member.

In the second embodiment of the present invention, a supporting block is protruded from the base so as to support the other end of the first supporting part, and the first supporting part is spaced apart from a lower surface of the base, and the other end of the first supporting part is contacted with the supporting block so and thus prevented from being moved down when the first supporting part is deformed to be bent by the piezoelectric element.

In the second embodiment of the present invention, each pair of the first and second supporting parts is formed at both sides of the coupling part.

In the second embodiment of the present invention, the first and second supporting parts are symmetric with respect to a center portion of the panel member.

In the second embodiment of the present invention, the panel member comprises a frame of which a lower portion is coupled to the coupling part; a liquid crystal part which is settled on an upper portion of the frame; and a touch pad which is coupled to the upper portion of the frame while covering an upper surface of the frame, wherein a first settling groove for settling the liquid crystal part and a second settling groove for settling the touch pad are formed in an upper surface of the frame, and a spacing groove is formed at a lower portion of the frame so as to be spaced apart from the first and second supporting parts.

In the second embodiment of the present invention, the haptic module further comprises a control part for controlling the electric power applied to the piezoelectric element, wherein the piezoelectric element is deformed by the electric power applied by the control part so as to vibrate the vibration member and the panel member, and a voltage applied to the piezoelectric element has a sine wave.

In the second embodiment of the present invention, a frequency of the voltage applied to the piezoelectric element is a resonance frequency which is the same as a natural frequency of the vibration member.

In the second embodiment of the present invention, the frequency of the voltage applied to the piezoelectric element is 100 to 350 Hz.

Advantageous Effects

As described above, the haptic module according to the present invention has the effects, as follows:

Since the vibration member is moved up and down by the piezoelectric device, the force is effectively transmitted to the panel member, thereby enhancing the driving force and thus improving the vibration feeling of the panel member or the click feeling.

Since the sine wave voltage is applied to the piezoelectric element, it is possible to reduce the noise generated by the sudden vibration of the vibration member, and since the slope of the input voltage is gentle, the momentary power consumption can be reduced.

Further, since the frequency of the voltage applied to the piezoelectric element is the same as the resonance frequency of the vibration member, it is possible to maximize the displacement of the vibration member, thereby improving the click feeling.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

| | |
|---|---|
| 110: mobile terminal body | |
| 120: base | 121: groove |
| 130: vibration member | 131: spacing hole |
| 135: elastic supporting part | 140: touch pad |
| 150: cushion member | 160: mobile terminal cover |
| 161: opening hole | 170: piezoelectric element |
| 220: base | 222: insertion hole |
| 224: supporting block | 230: vibration member |
| 232: coupling part | 234: first supporting part |
| 236: second supporting part | 237: upper supporting part |
| 238: lower supporting part | 239: bent part |
| 250: liquid crystal part | 240: touch pad |
| 260: frame | 262: spacing groove |
| 263: first settling groove | 264: second settling groove |
| 270: piezoelectric element | 280: panel member |

BEST MODE

Hereinafter, the embodiments of the present invention will be described in detail with reference to accompanying drawings.

Figure 1:
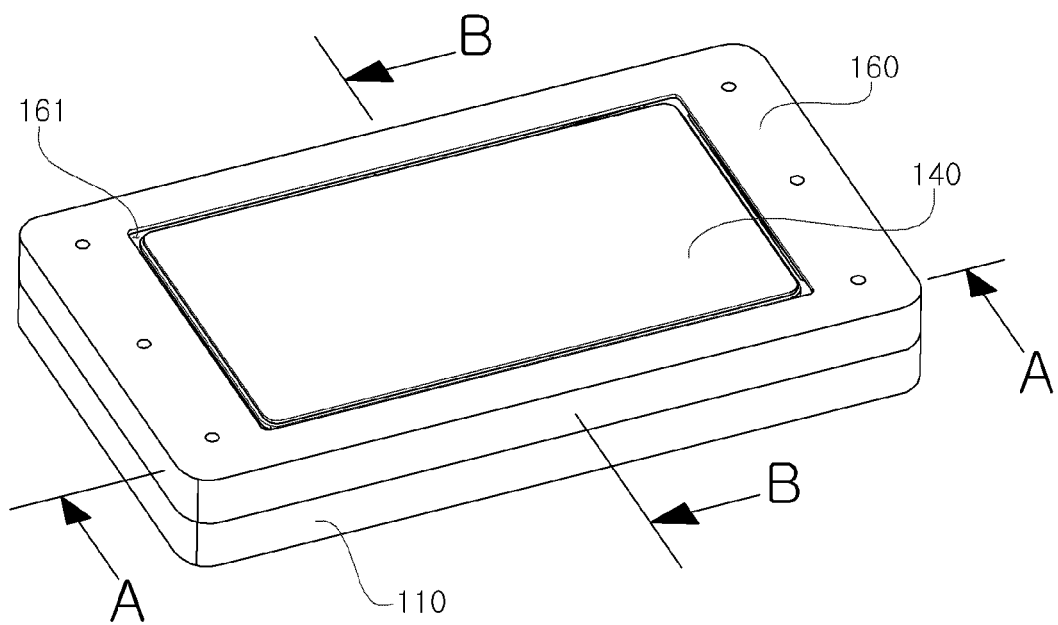
FIG. 1 is a perspective view of a mobile terminal with a haptic module according to a first embodiment of the present invention.
Figure 2:
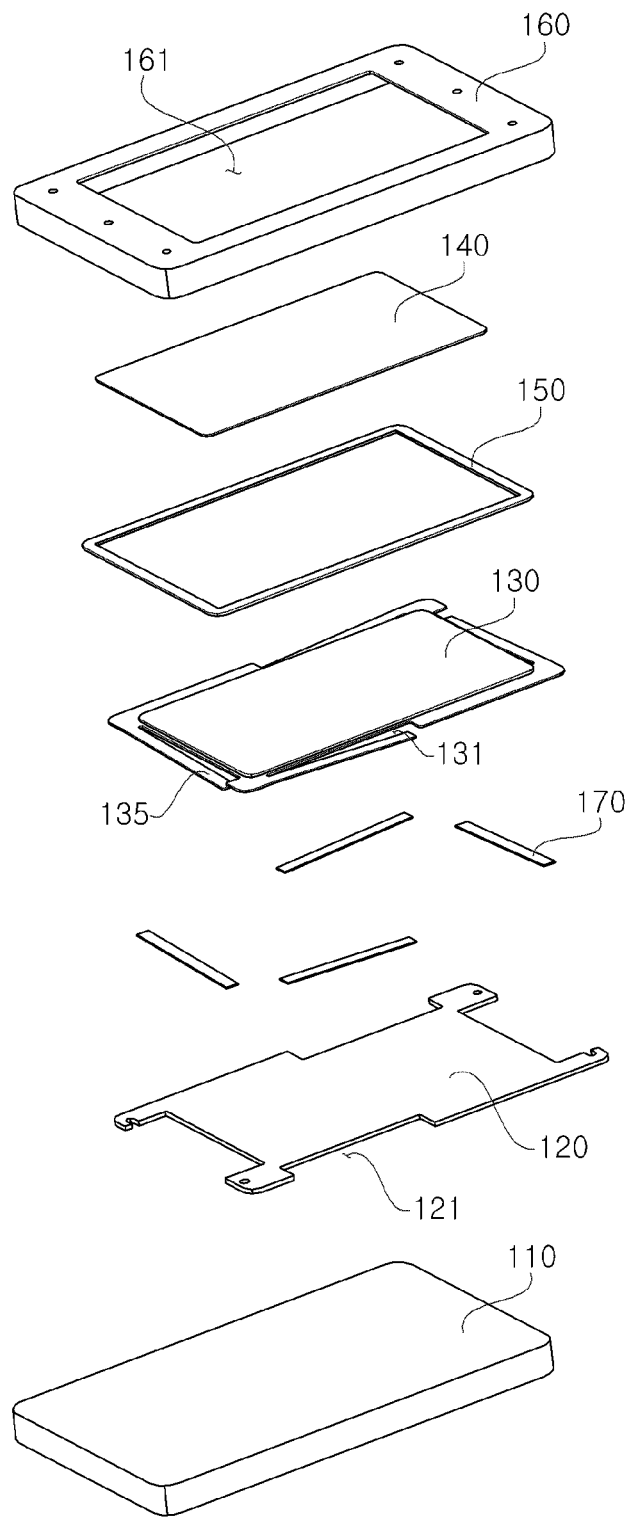
FIG. 2 is an exploded perspective view of the mobile terminal with the haptic module according to the first embodiment of the present invention.
Figure 3:
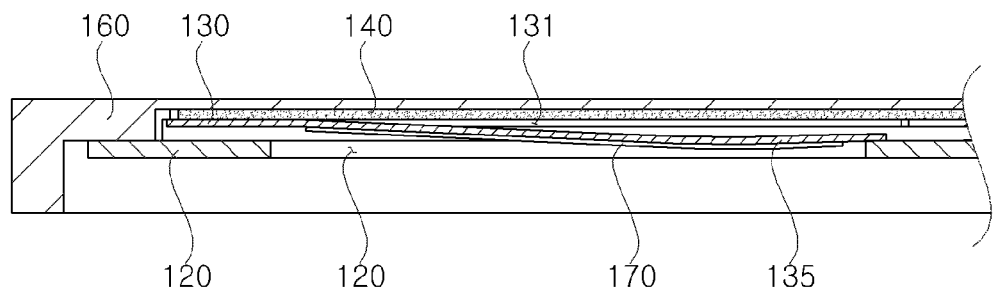
FIG. 3 is a cross-sectional view taken along a line A-A of FIG. 1.
Figure 4:
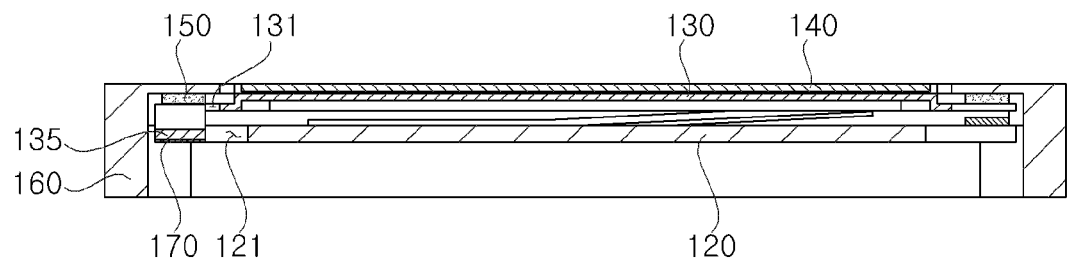
FIG. 4 is a cross-sectional view taken along a line B-B of FIG. 1.
Figure 5:
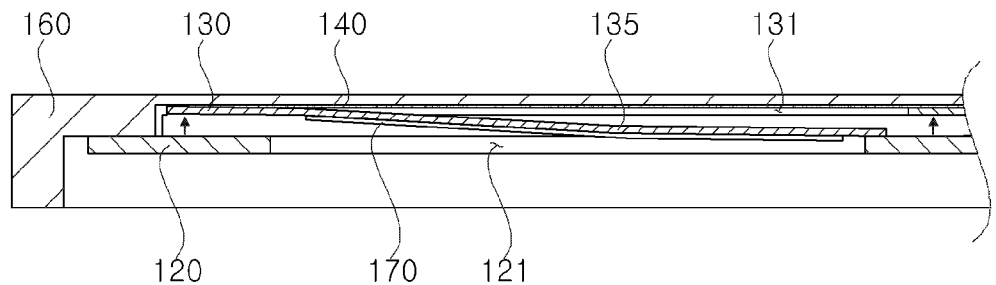
FIGS. 5 and 6 are views showing an operation process of the mobile terminal with the haptic module according to the first embodiment of the present invention.
Figure 6:
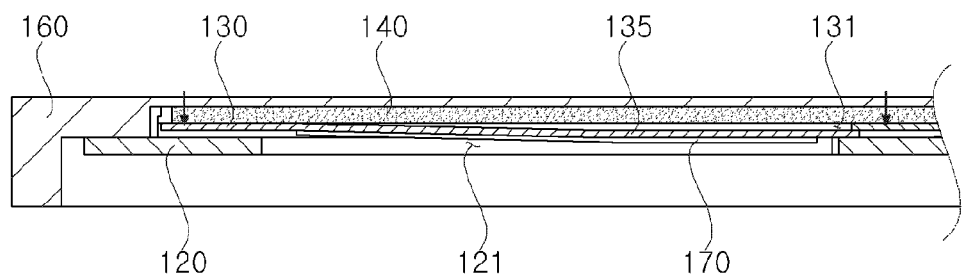

FIG. 1 is a perspective view of a mobile terminal with a haptic module according to a first embodiment of the present invention, FIG. 2 is an exploded perspective view of the mobile terminal with the haptic module according to the first embodiment of the present invention, FIG. 3 is a cross-sectional view taken along a line A-A of FIG. 1, FIG. 4 is a cross-sectional view taken along a line B-B of FIG. 1, and FIGS. 5 and 6 are views showing an operation process of the mobile terminal with the haptic module according to the first embodiment of the present invention.

As shown in FIGS. 1 to 6, a haptic module according to a first embodiment of the present invention comprises a base 120, a vibration member 130, a touch pad 140, a cushion member 150, an elastic supporting part 135 and a piezoelectric device 170. For convenience of explanation, hereinafter, a mobile terminal including a mobile terminal body 110, a mobile terminal cover 160 and the above-mentioned elements will be described.

In the mobile terminal body 110 shown in FIGS. 1 and 2, a main board and other elements are installed so as to implement various functions according to information input through the touch pad 140.

In FIGS. 3 to 6, the mobile terminal body 110 is not shown in order to clearly show main parts.

The base 120 is disposed on the mobile terminal body 110.

The base 120 is formed into a rectangular plate shape and formed of a SUS material.

Further, multiple grooves 121 are formed along an outer edge of the base 120.

Each of the grooves 121 is formed into a rectangular shape which is opened up/downwards and outwards and disposed at a lower side of the elastic supporting part 135 to be described later.

As described later, the piezoelectric device 170 disposed at a lower side of the elastic supporting part 135 is inserted into the groove 121 upon bending deformation of the elastic supporting part 135. And a width of the groove 121 is formed to be larger than a width of the piezoelectric device 170 in a direction orthogonal to a length direction of the elastic supporting part 135, such that the piezoelectric device 170 and the base 120 are not interfered with each other.

The vibration member 130 is disposed on the base 120 so as to be movable up and down.

The vibration member 130 is formed into a rectangular plate shape, formed of a SUS material, and disposed at an upper side of the base 120 so as to be spaced apart from the base 120 and elastically supported upwards, as described later.

A spacing hole 131 which allows an outer surface of the elastic supporting part 135 to be spaced apart from the vibration member 130 is formed to be opened up and downward.

Four spacing holes 131 are respectively formed at each edge portion of the vibration member 130. A width of the spacing hole 131 in a direction orthogonal to a length direction of the elastic supporting part 135 is formed to be larger than a width of the elastic supporting part 135, such that the outer surface of the elastic supporting part 135 is spaced apart from a side surface of the vibration member 130.

As described above, since the vibration member 130 is formed with the spacing hole 131 so that the outer surface of the elastic supporting part 135, the interference between the elastic supporting part 135 and the vibration member 130 is reduced upon the bending deformation of the elastic supporting part 135, and thus the elastic supporting member 135 can be easily deformed to be bent with small force.

Further, the touch pad 140 and the cushion member 150 are disposed on the vibration member 130.

The touch pad 140 formed of LED crystal liquid outputs images showing various information of the mobile terminal 110, and also receives input information by sensing a touch and then transfers it to the mobile terminal body 110.

The cushion member 150 is formed of an elastic rubber material, formed into a hollowed rectangular shape and also formed along an outer surface of the touch pad 140.

The mobile terminal cover 160 is fixedly coupled to the base 120 while covering an upper portion of the touch pad 140.

More detailedly, a lower portion of the mobile terminal cover 160 is opened so that the base 120, the vibration member 150 and the touch pad 140 are disposed therein, and while an inner lower surface of the mobile terminal cover 160 is contacted with the cushion member 150 so as to press the vibration member 130 toward the base 120, the mobile terminal cover 160 is fixed to the base 120.

Thus, the cushion member disposed between the mobile terminal 160 and the vibration member 130 is slightly compressed and closely contacted with the mobile terminal cover 160 and the vibration member 130, thereby completely closing between the mobile terminal cover 160 and the vibration member 130.

As described above, since the cushion member 150 is disposed to be closely contacted between the mobile terminal cover 160 and the vibration member 130, it is prevented that foreign substances are penetrated into the mobile terminal cover 160 and the vibration member 130 is inclined. Further, the cushion member 150 functions as an insulator for insulating the mobile terminal cover 160.

Of course, the vibration member 130 is supported toward the base 120 by the elastic supporting part 130, as described above, and thus not closely contacted with the base 120.

Further, an opening hole 161 in which the touch pad 140 is inserted is formed in an upper portion of the mobile terminal cover 160 so as to pass through the upper portion thereof up and down, so that an upper portion of the touch pad can be exposed to an outside.

The elastic supporting part 135 is formed into a rectangular bar shape and provided in four parts each of which is disposed at each edge portion of the vibration member 130.

And one end of the elastic supporting part 135 is integrally connected with the vibration member 130, and the other end thereof is connected with the base 120.

In other words, one end of the elastic supporting part 135 is integrally formed with an outer end of the vibration member, which forms the spacing hole 131, and the other end thereof is connected with the base 120 so as to be separated and spaced apart from the vibration member 130.

And the other end of the elastic supporting part 135 is formed to be inclined downward, i.e., toward the base 120 and settled on the base 120.

That is, the other end of the elastic supporting part 135 is bent so as to be plastic-deformed downward about the one end thereof.

The elastic supporting par 135 is formed to be inclined downward in a normal state, and a distance between the other end and the one end thereof is formed to be larger than an up and down distance between the vibration member 130 and the base 120.

Therefore, in assembling the vibration member 130, if the other end of the elastic supporting part 135 is settled on the base 120, the one end of the elastic supporting part 135 elastically supports the vibration member 130 upwards while being slightly bent upward.

That is, when the mobile terminal cover 160 is fixed to base 120 while pressing the vibration member 130 toward the base 120, since the other end of the elastic supporting part 135 is connected with the upper portion of the base 120, it cannot be moved down but relatively bent upward about the one end of the elastic supporting part 135.

And if the other end of the elastic supporting part 135 is bent, the vibration member 130 connected with the one end of the elastic supporting part 135 is elastically supported upward.

As described above, since the elastic supporting part 135 is disposed between the vibration member 130 and the base 120 in the state of being compressed so as to elastically support the vibration 130 upward, it is possible to efficiently transmit force to the elastic supporting part 135 when the elastic supporting part 135 is deformed to be bent by the piezoelectric element 170, thereby enhancing driving force of the vibration member 130 and thus improving vibration feeling of the touch pad 140.

Further, the elastic supporting parts 135 have the same length, and each one end thereof is disposed to be adjacent to a vertex of the vibration member 130.

That is, the elastic supporting part 135 has a length similar to shorter one out of outer sides of the vibration member 130.

Thus, in case of the elastic supporting part 135 which is disposed at shorter one out of the outer sides of the vibration member 130, one end and the other end thereof are respectively disposed to be adjacent to each vertex of the vibration member 130. However, in case of the elastic supporting part 135 which is disposed at longer one out of the outer sides of the vibration member 130, only one end there is disposed to be adjacent to the vertex of the vibration member 130.

As described above, since the elastic supporting parts 135 have the same length and are respectively formed at the outer sides of the vibration member 130, they can support the vibration member 130 uniformly, thereby precisely implementing the haptic feedback in the touch pad 140.

Meanwhile, the piezoelectric device 170 is formed into a rectangular plate shape and disposed at a lower side of the elastic supporting part 139.

A GND electrode (not shown) is installed at an upper surface of the piezoelectric device 170, which is between the piezoelectric element 170 and the elastic supporting part 135, and a positive (+) electrode (now shown) is installed at a lower surface of the piezoelectric element 170.

The GND electrode and the positive (+) electrode are formed to be very thin on the upper and lower surfaces of the piezoelectric element 170, and do not shown in the drawings.

If electric power is applied to the piezoelectric element 170 through the GND electrode and the positive (+) electrode, the piezoelectric element 170 is contracted or expanded in a length direction thereof, and thus the elastic supporting part 135 is deformed to be bent upward and downward.

The piezoelectric element 170 is inserted into the groove 121 which is disposed at a lower side of the elastic supporting part 135.

As described above, since the groove 121 is disposed at the lower side of the elastic supporting part 135 and formed at the base 120 so as to be is formed to have a larger width than the width of the piezoelectric device 170 in the direction orthogonal to the length direction of the elastic supporting part 135, the piezoelectric element 170 is not interfered with the base 120 upon the bending deformation of the elastic supporting part 135, thereby preventing a short circuit between the positive (+) electrode and the base 120 and achieving smooth operation thereof Further, if necessary, the GND electrode may be installed at the lower surface of the piezoelectric device 170, and the positive (+) electrode may be installed at the upper surface of the piezoelectric element 170. However, if the positive (+) electrode is installed at the upper surface of the piezoelectric element 170, a short circuit may be occurred when the lower surface of the elastic supporting part 135 is contacted with the upper surface of the piezoelectric element 170. Therefore, it is preferable that the GND electrode is installed at the upper surface of the elastic supporting part 135, and the positive (+) electrode is installed at the lower surface thereof, like in the first embodiment.

Hereinafter, the operation processes of the mobile terminal having the above-mentioned haptic module of the present invention will be described.

FIG. 5 shows the state that the vibration member 130 is moved upward, and FIG. 6 shows the state that the vibration member 130 is moved downward.

As shown in FIG. 5, if the piezoelectric element 170 is contracted in its length direction, a length of the lower surface of the elastic supporting part 135 is shorter than that of the upper surface thereof, and thus a force by which the other end of the elastic supporting part 135 is bent to be further inclined downward is generated at the elastic supporting part 135.

However, since the other end of the elastic supporting part 135 is connected with the upper surface of the base 120 and thus it cannot be moved down, the vibration member 130 which is integrally connected with one end of the elastic supporting part 135 is relatively moved upward.

Herein, the cushion member 150 is compressed toward the mobile terminal cover 160 so as to be thin and also further closely contacted between the mobile terminal cover 160 and the vibration member 130.

On the contract to this, as shown in FIG. 6, if the piezoelectric element 170 is expanded in its length direction, the length of the lower surface of the elastic supporting part 135 is longer than that of the upper surface thereof, and thus a force by which the other end of the elastic supporting part 135 is bent to be inclined upward is generated at the elastic supporting part 135.

However, since the vibration member 130 which is connected with one end of the elastic supporting part 135 is supported by the cushion member 150 and the mobile terminal cover 160, the one end of the elastic supporting part 135, i.e., the vibration member 130 is relatively moved downward.

Herein, the cushion member 150 is expanded toward the vibration member 130 so as to be thick and also closely contacted between the mobile terminal cover 160 and the vibration member 130.

As described above, if the piezoelectric element 170 is continuously contracted and expanded, the elastic supporting part 135 is continuously bent upward and downward, and the vibration member 130 is vibrated up and down, and thus a user can sense the haptic feedback through the touch pad 140.

As described above, since the elastic supporting part 135 is disposed in a state of being compressed between the vibration member 130 and the base 120 so as to elastically support the vibration member 130 upward, it is possible to efficiently transmit force to the elastic supporting part 135 when the elastic supporting part 135 is deformed to be bent by the piezoelectric element 170, thereby enhancing driving force of the vibration member 130 and thus improving vibration feeling of the touch pad 140.

Figure 7:
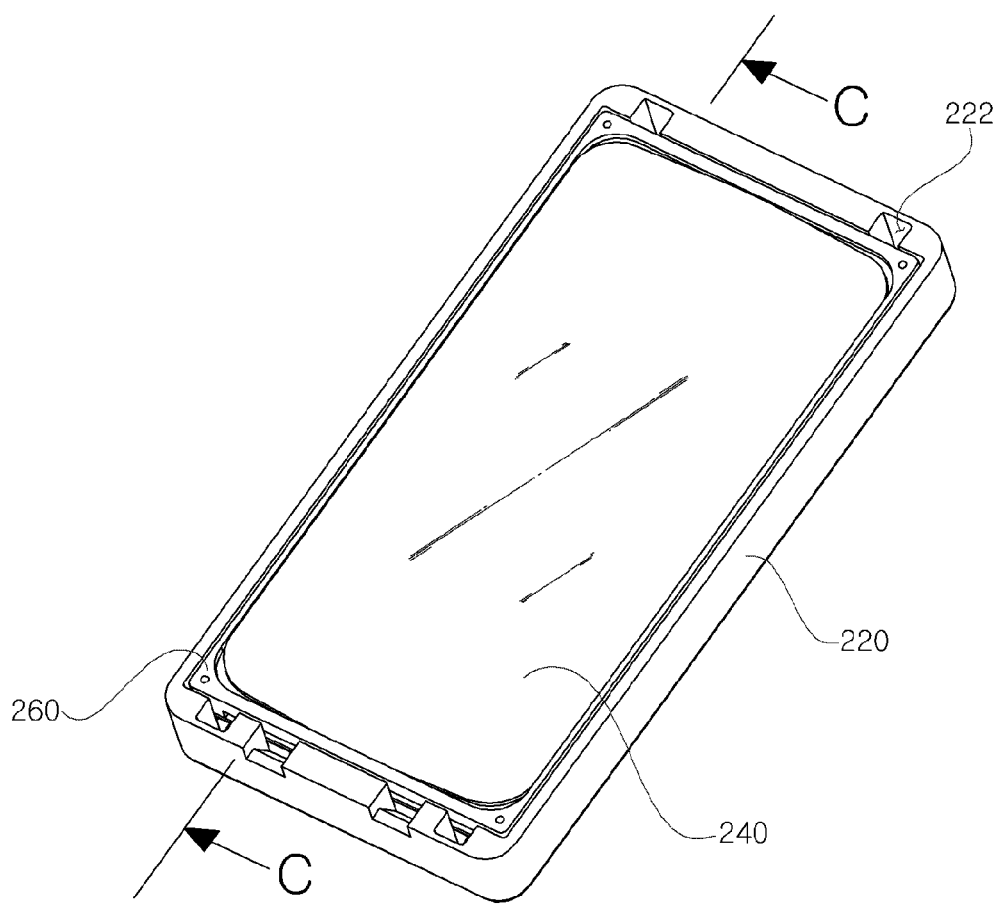
FIG. 7 is a perspective view of a mobile terminal with a haptic module according to a second embodiment of the present invention.
Figure 8:
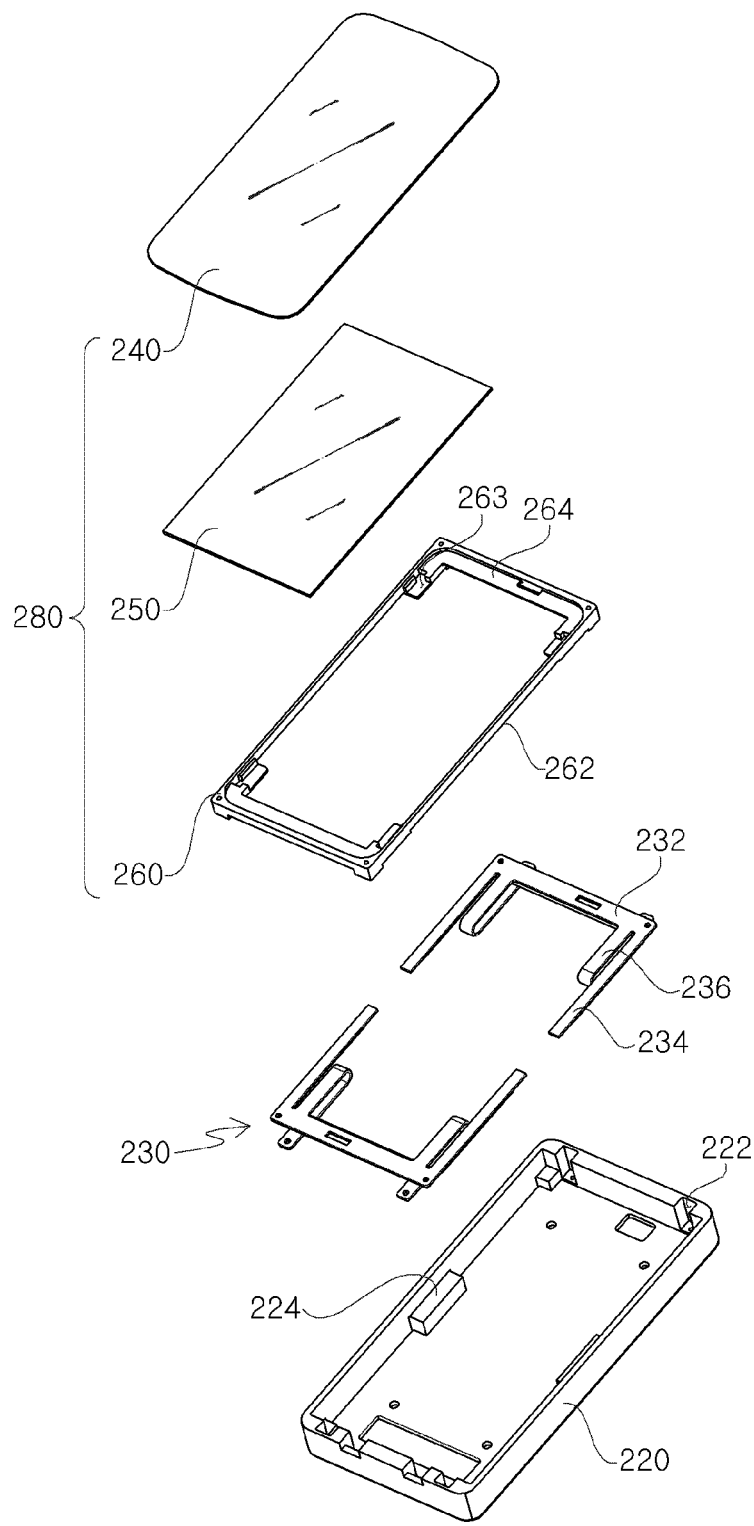
FIG. 8 is a one directional exploded perspective view of the haptic module according to the second embodiment of the present invention.
Figure 9:
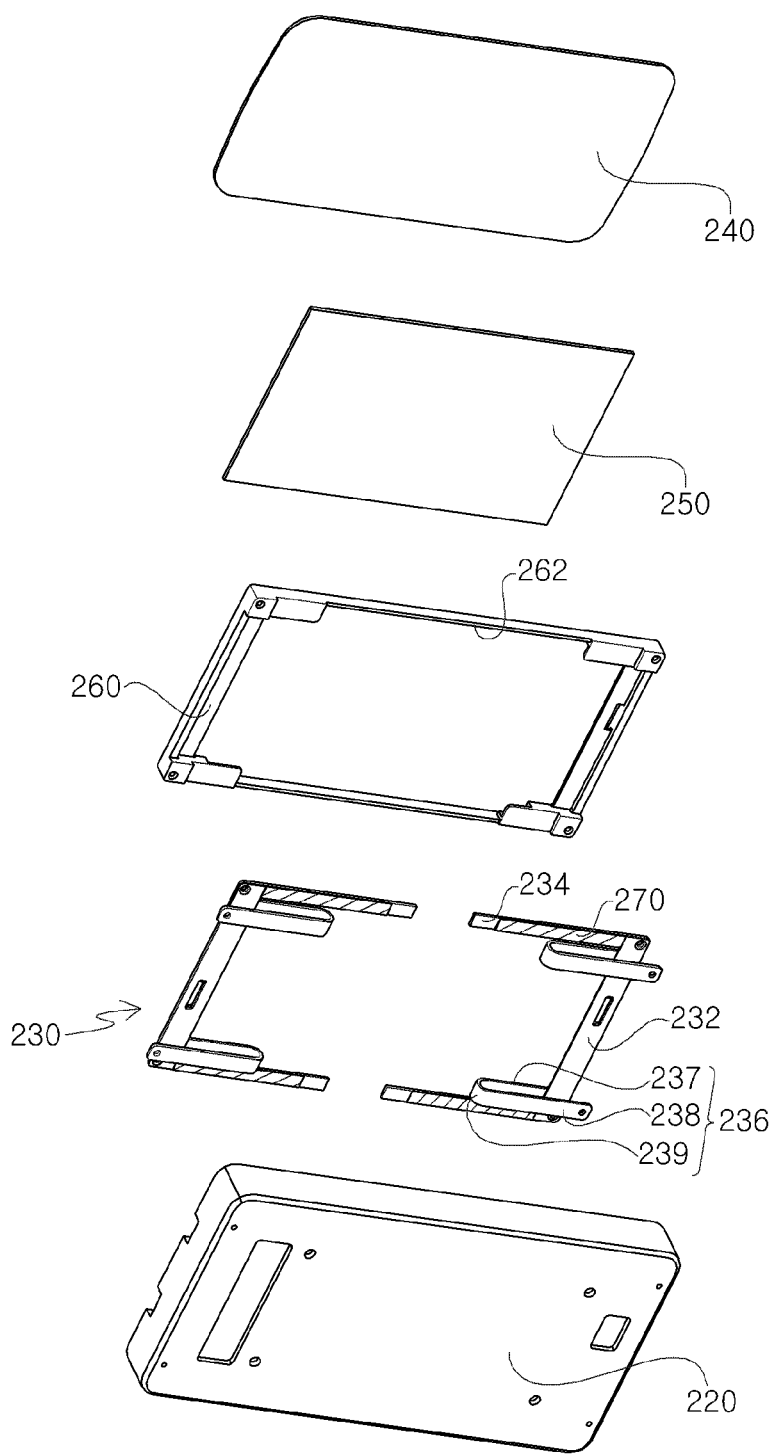
FIG. 9 is another directional exploded perspective view of the haptic module according to the second embodiment of the present invention.
Figure 10:
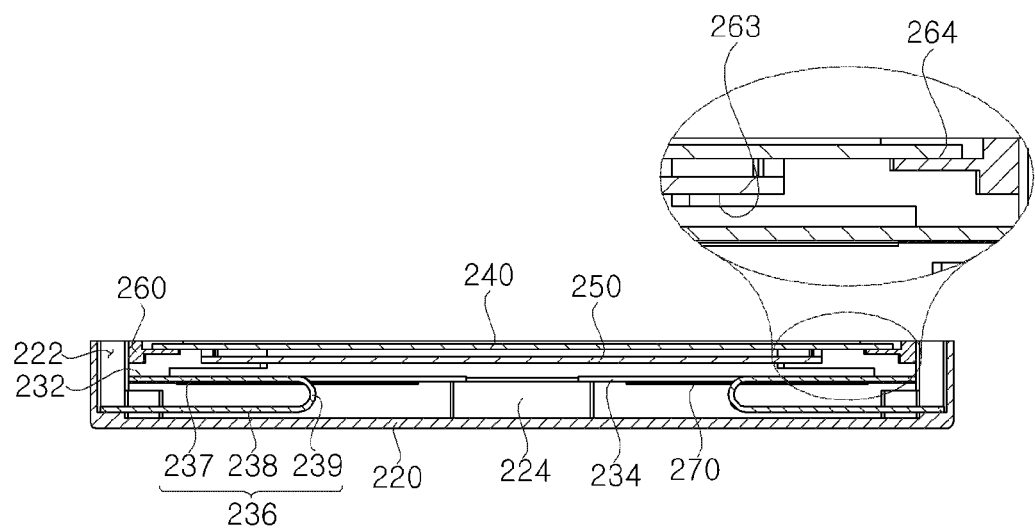
FIG. 10 is a cross-sectional view taken along a line C-C of FIG. 7.
Figure 11:
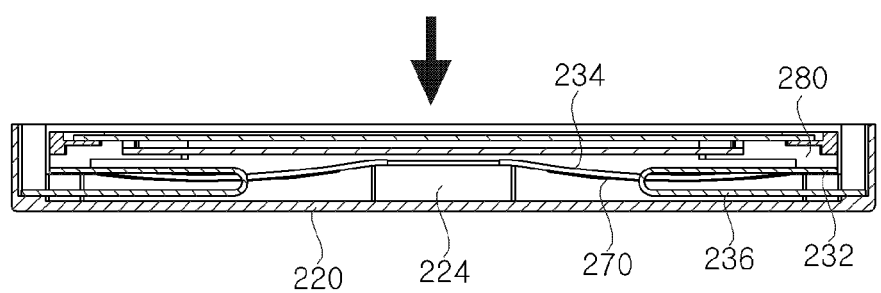
FIG. 11 is a cross-sectional view showing a state that a vibration member and a panel member are moved down by a piezoelectric device in FIG. 10.
Figure 12:
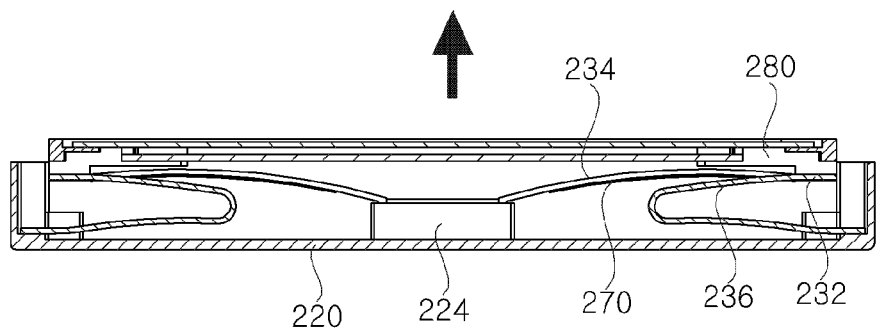
FIG. 12 is a cross-sectional view showing a state that the vibration member and the panel member are moved up by the piezoelectric device in FIG. 10.

FIG. 7 is a perspective view of a mobile terminal with a haptic module according to a second embodiment of the present invention, FIG. 8 is a one directional exploded perspective view of the haptic module according to the second embodiment of the present invention, FIG. 9 is another directional exploded perspective view of the haptic module according to the second embodiment of the present invention, FIG. 10 is a cross-sectional view taken along a line C-C of FIG. 7, FIG. 11 is a cross-sectional view showing a state that a vibration member and a panel member are moved down by a piezoelectric device in FIG. 10, and FIG. 12 is a cross-sectional view showing a state that the vibration member and the panel member are moved up by the piezoelectric device in FIG. 10.

As shown in FIGS. 7 to 12, the haptic module of the present invention includes a base 220, a vibration member 230, a piezoelectric element 270, a panel member 280 and a control part (not shown).

The base 220 is formed into a hexahedral shape of which an upper portion is opened, and the vibration member 230, the piezoelectric element 270 and the panel member 280 are disposed therein.

The base 220 is formed with an insertion hole 222 in which a second supporting part 236 of the vibration member 230 is inserted and coupled, as described later, and a supporting block 224 which supports a distal end of a first supporting part 234 of the vibration member 230.

The vibration member 230 is disposed at an upper side of the base 220 so as to be moved up and down and comprised of a coupling part 232, the first supporting part 234 and the second supporting part 236.

The coupling part 232 is formed into a flat plate shape and coupled to a lower portion of a frame of the panel member 280. A circuit board is disposed at a lower side of the coupling part 232.

The coupling part 232 formed into a hollowed rectangular shape may be coupled to the lower portion of the frame of the panel member 280, or may be divided into two parts, like in the second embodiment, so that one is coupled to one side of the frame of the panel member 280 and the other is coupled to the other side of the frame of the panel member 280. Otherwise, the coupling part 232 may be divided into two or more parts.

Herein, the coupling part 232 is disposed to be symmetric with respect to a center portion of the panel member 280 so that the vibration member 230 stably supports the panel member 280 upward and downward.

The first supporting part is formed into a bar shape so as to be horizontally protruded from the coupling part 232.

That is, the one end of the first supporting part 234 is integrally connected to the coupling part 232, and the other end thereof is horizontally protruded.

In the second embodiment, the first supporting part 234 is provided from the both sides of the coupling part 232, respectively.

The second supporting part 236 is protruded from the coupling part 232 so as to be parallel with the first supporting part 234, and a distal end thereof is bent downward and fixed to the base 220.

The second supporting part 236 is disposed at a more inner side than the first supporting part 234 and protruded from both sides of the coupling part 232, respectively.

That is, the first and second supporting parts 234 and 236 are formed at the both sides of the coupling part 232 so as to be provided in pair.

The first and second supporting parts 234 and 236 are disposed to be symmetric with respect to the panel member 280, thereby stably supporting the panel member 280.

In the second embodiment, the coupling part 232 is divided into two parts, and the first and second supporting parts 234 and 236 formed at each coupling part 232 are protruded in an opposite direction to each other.

The piezoelectric element 270 is coupled at a lower side of the supporting part 234.

The piezoelectric element 270 is installed at the first supporting part 234, and thus it is contracted and expanded so as to bend the first supporting part 234 upward and downward, when electric power is applied, thereby generating vibration so that the panel member 280 can be moved up and down.

Since the structure that the piezoelectric element 270 is contracted and expanded when electric power is applied is already well-known in the prior art, the description thereof will be omitted.

The other end, i.e., a distal end of the first supporting part 234 is supported by the supporting block 224 which is protruded to an inner side of the base 220.

The other end of the first supporting part 234 is not fixed to the supporting block 224, but the lower portion of the other end thereof is simply contacted with an upper surface of the supporting block 224.

Further, the first supporting part 234 is spaced apart from a lower surface of the base 220.

Therefore, when the first supporting part 234 is deformed to be bent by the piezoelectric element 270, the other end of the first supporting part 234 is contacted with the supporting and prevented from being moved down, and the panel member 280 and the coupling part 232 connected to one end of the first supporting part 234 are instead moved up relatively.

The second supporting part 236 is comprised of an upper supporting part 237, a lower supporting part 238 and a bent part 239.

One end of the upper supporting part 237 is connected with the coupling part 232, and the other end thereof is horizontally protruded to be parallel with the first supporting part 234.

The upper supporting part 237 is shorter than the first supporting part 234.

The lower supporting part 238 is disposed at a lower side of the upper supporting part 237 so as to be spaced apart from the upper supporting part 237, and one end thereof as a distal end of the second supporting part 236 is fixed to the base 220.

The one end of the lower supporting part 238, i.e., the distal end of the second supporting part 236 is fixedly inserted into the insertion hole 222 formed in the base 220 and thus prevented from being moved up and down as well as left and right.

The one end of the lower supporting part 238 is more protruded to the outside than the coupling part 232 and inserted into the insertion hole 222.

The bent part 239 is formed into a '∪' shape, and one end of the bent part 239 is connected to the other end of the upper supporting part 237, and the other end thereof is connected to the other end of the lower supporting part 238.

Due to such structure, the second supporting part 236 can elastically support the coupling part 232 and the panel member 280 upward and downward.

The panel member 280 is installed on the vibration member 230 and comprised of a frame 260, a liquid crystal part 250 and a touch pad 240.

The frame 260 is formed into a rectangular shape, and a lower portion thereof is coupled to the coupling part 232.

The coupling part 232 is formed with a first settling groove 263 for settling the liquid crystal part 250 and a second settling groove 264 for settling the touch pad 240. The first settling groove 263 is formed in the second settle groove 264 to be deeper.

The liquid crystal part 250 is settled in the first settling groove 263 formed at an upper portion of the frame 260.

The touch pad 240 is settled in the second settling groove 264 formed at an upper portion of the frame 260, while covering an upper portion of the liquid crystal part 250.

Meanwhile, the first and second supporting parts 234 and 236 are spaced apart from a lower surface of the panel member 280.

This is to prevent that the first and second supporting parts 234 and 236 are contacted with the lower surface of the panel member 280 when the vibration member 230 is deformed to be bent by the piezoelectric element 270 and thus the bending deformation is interfered.

To this end, a spacing groove 262 is formed at a lower portion of the frame 260 so as to be spaced apart from the first and second supporting parts 234 and 236.

The control part controls electric power applied to the piezoelectric element 270.

That is, if it is sensed by a separate sensor (not shown) installed at the panel member 280 that the panel member 280 is touched by a user, the control part applies the electric power to the piezoelectric element 270.

When the power is applied by the control part, the piezoelectric element 270 is deformed to be bent upward and downward, and thus the panel member 280 and the vibration member 230 having the piezoelectric element 270 are moved up and down, thereby generating the vibration. A user senses the vibration as click feeling according to a touch operation.

The haptic module of the present invention is not limited to the above-mentioned embodiment, and it can be applied to all cases that the piezoelectric element 270 is installed at the vibration member 230.

To this end, in the haptic module of the present invention, the piezoelectric element 270 is installed at the vibration member 230, and the vibration member 230 generates the vibration when the electric power is applied to the piezoelectric element 270, and thus the user can sense the click feeling.

Herein, a voltage applied to the piezoelectric element 270 has a sine wave.

That is, the input voltage has not a conventional square wave which is sharply changed, but has a curved wave which has a gentler slope than the square wave and a regular period.

Herein, a frequency of the voltage applied to the piezoelectric element 270 is a resonance frequency which is the same as a natural frequency of the vibration member 230.

Thus, when the electric power is applied to the piezoelectric element 270, since the a frequency of the voltage is the same as the natural frequency of the vibration member 230, a displacement of the vibration member 230 is maximized, thereby further improving the click feeling.

Preferably, the frequency of the voltage applied to the piezoelectric element 270 is 100~350 Hz.

That is, since the natural frequency of the vibration member 230 is 100~350 Hz and the frequency of the voltage applied to the piezoelectric element 270 is 140~350 Hz, the displacement of the vibration member 230 is increased by resonance phenomenon.

Hereinafter, the operation processes of the present invention having the above-mentioned structure will be described.

When the electric power is not applied to the piezoelectric element 270, the vibration member 230 supports the panel member 280 upward without any deformation, as shown in FIG. 10.

Detailedly, the first supporting part 234 is disposed horizontally, and the other end thereof is contacted with the upper portion of the supporting block 224.

And the second supporting part 236 is bent, and the distal end thereof is fixedly inserted into the insertion hole 222.

In this state, if a user touches the touch panel 240, the electric power is applied so that the piezoelectric element 270 is expanded. Therefore, as shown in FIG. 11, while the piezoelectric element 270 is expanded, the first supporting part 234 coupled with the piezoelectric element 270 is bent downward.

That is, while the piezoelectric element 270 is expanded, one end and the other end of the first supporting part 234 coupled with the piezoelectric element 270 are relatively bent upward about a center portion thereof.

When the one end and the other end of the first supporting part 234 are bent upward, they are closer to each other, and thus a distance between them becomes shorter.

In this state, since the one end of the first supporting part 234 is coupled to the frame 260 through the coupling part 232 and thus it cannot be moved, the other end of the first supporting part 234 is moved to the one end thereof.

As the other end of the first supporting part 234 is moved to the one end thereof, the first supporting part 234 is moved downward to be bent. And as the first supporting part 234 is moved downward, the other end of the first supporting part 234 is moved down together with the panel member 280 while compressing the second supporting part 236.

Then, if the electric power is applied so that the piezoelectric element 270 is contracted, the piezoelectric element 270 is contracted as shown in FIG. 12, and the first supporting part 234 coupled with the piezoelectric element 270 is bent upward.

That is, while the piezoelectric element 270 is contracted, one end and the other end of the first supporting part 234 coupled with the piezoelectric element 270 are relatively bent downward about the center portion thereof.

When the one end and the other end of the first supporting part 234 are bent downward, they are closer to each other, and thus the distance between them becomes shorter.

In this state, since the one end of the first supporting part 234 is coupled to the frame 260 through the coupling part 232 and thus it cannot be moved, the other end of the first supporting part 234 is moved to the one end thereof.

As the other end of the first supporting part 234 is moved to the one end thereof, the first supporting part 234 is moved upward to be bent. And as the first supporting part 234 is moved upward, the other end of the first supporting part 234 is moved up together with the panel member 280 while expanding the second supporting part 236.

As described above, the up and down movement of the panel member 280 is rapidly performed when a user's finger is touched on the touch pad 240, and thus the user can sense force generated by the up and down movement of the panel member 280, i.e., the vibration feeling.

When the user touches the touch pad 240, the up and down movement of the panel member 280 may be occurred only once, or many times with a short period, like in a vibration motor.

Meanwhile, if the electric power applied to the piezoelectric element 270 is shut off, the vibration member 230 and the panel member 280 are returned to an initial state by elastic restoring force of the second supporting part 236 which is expanded, as shown in FIG. 10.

Herein, if the voltage applied to the piezoelectric element 270 has a sine wave and a frequency which is the same as the resonance frequency of the vibration member 230, the vibration member 230 and the panel member 280 have improved vibration characteristics, and thus it is possible to provide the enhanced click feeling to the user.

Figure 16:
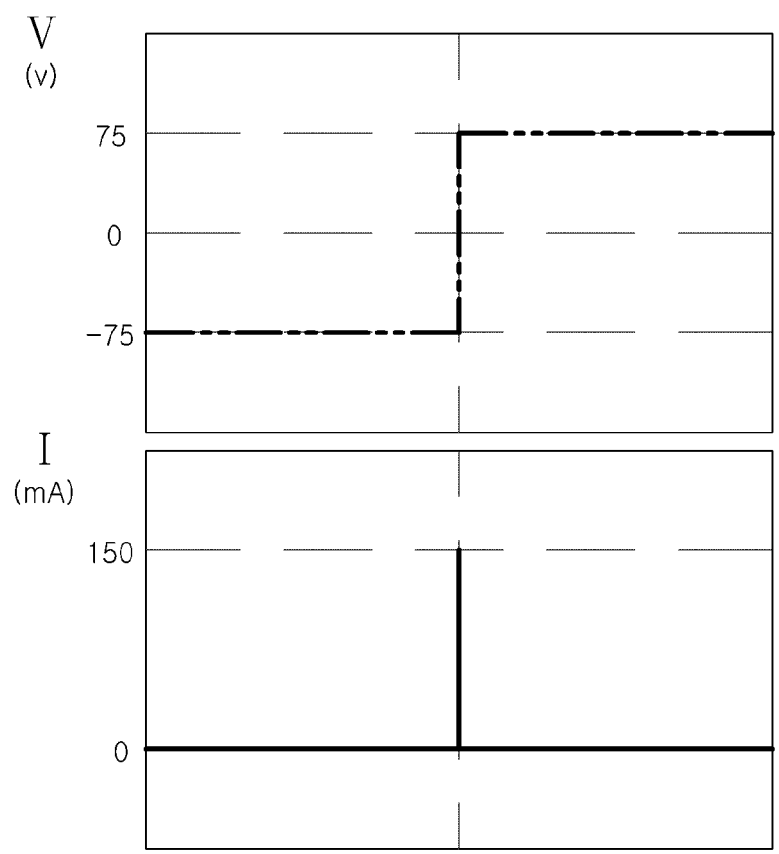
FIG. 16 is a graph showing waveforms of a voltage and a current applied to the conventional piezoelectric device.

As described in the background art and shown in FIG. 16, if the square wave voltage is applied to the piezoelectric element 270, the input maximum voltage is 75V, and the output maximum current is 150 mA.

Therefore, the momentary power consumption is 75V× 0.15 A=about 11.25 W.

Figure 13:
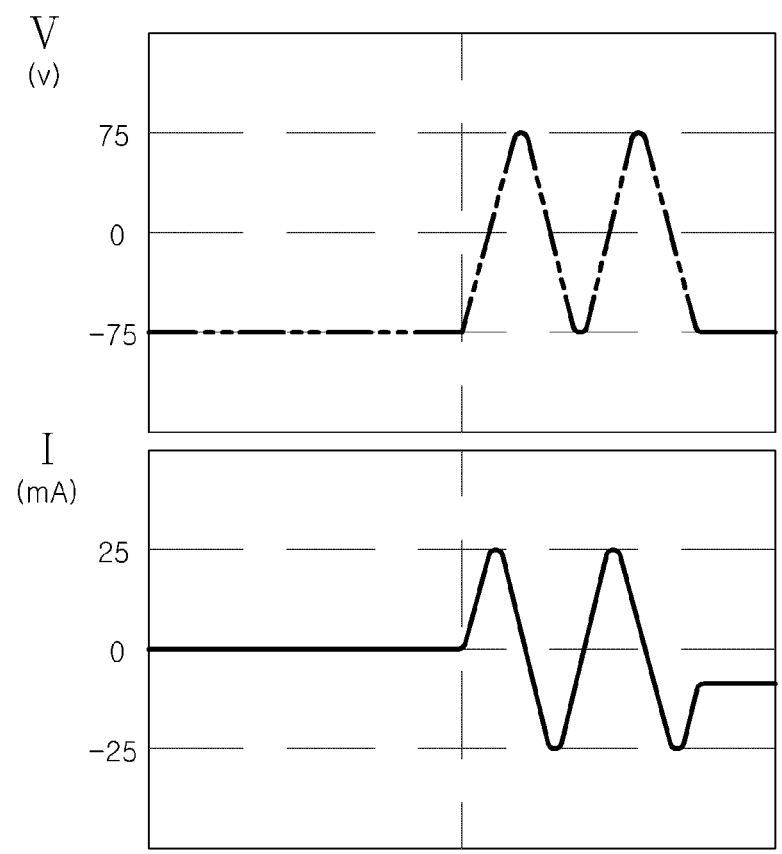
FIG. 13 is a graph showing waveforms of a voltage and a current applied to the piezoelectric device according to a third embodiment of the present invention.

However, if the voltage applied to the piezoelectric element 270 has the sine wave, the output maximum current is 25 mA, in case of the same input maximum voltage (75V), as shown in FIG. 13.

Therefore, the momentary power consumption is 75V× 0.025 A=about 2 W.

As described above, if the voltage applied to the piezoelectric element 270 is changed from the square wave to the sine wave, the power consumption can be reduced remarkably.

Further, since a slope of the sine wave is gentler than that of the square wave, it is possible to reduce noise generated by sudden displacement of the vibration member.

FIG. 13 shows a bode plot in case that the frequency of the voltage applied to the piezoelectric element 270 is the same as the resonance frequency of the vibration member 230.

Figure 14:
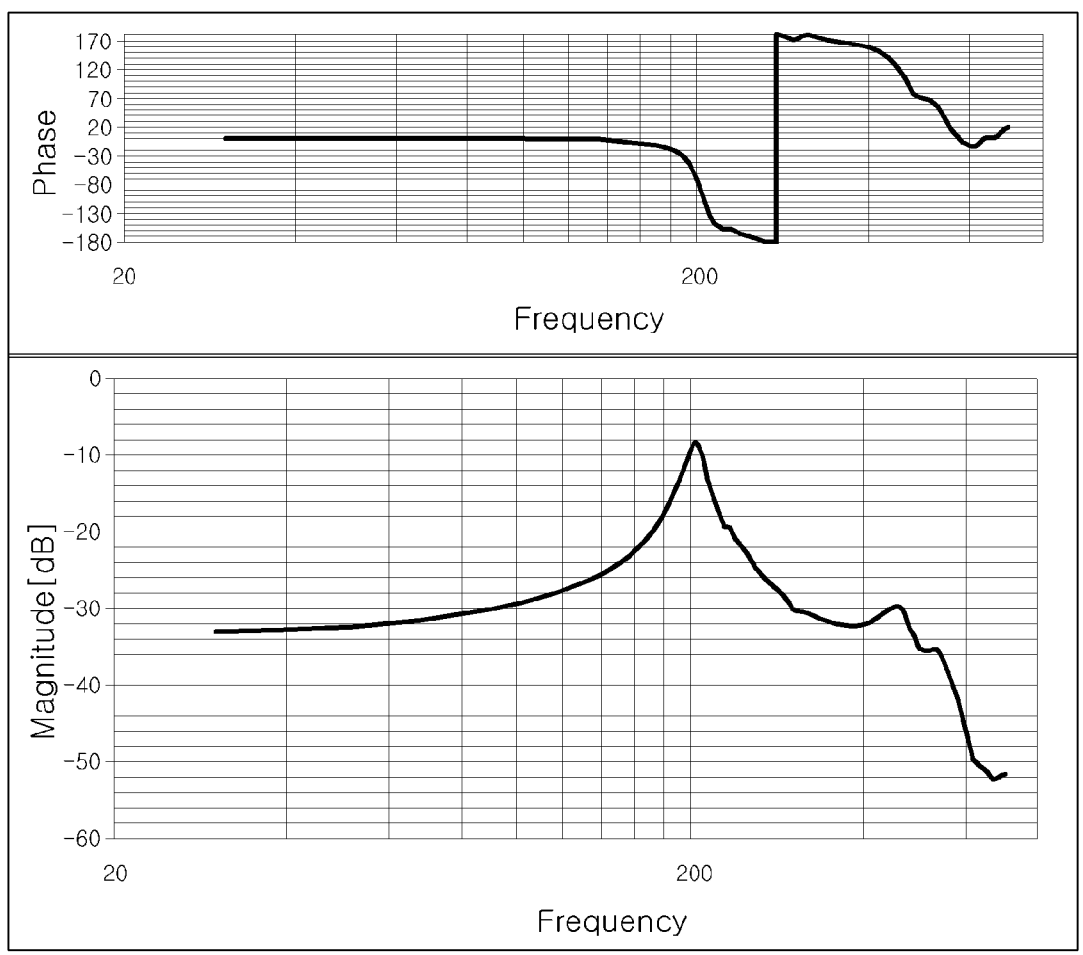
FIG. 14 is a graph showing a bode plot according to the third embodiment of the present invention.
Figure 15:
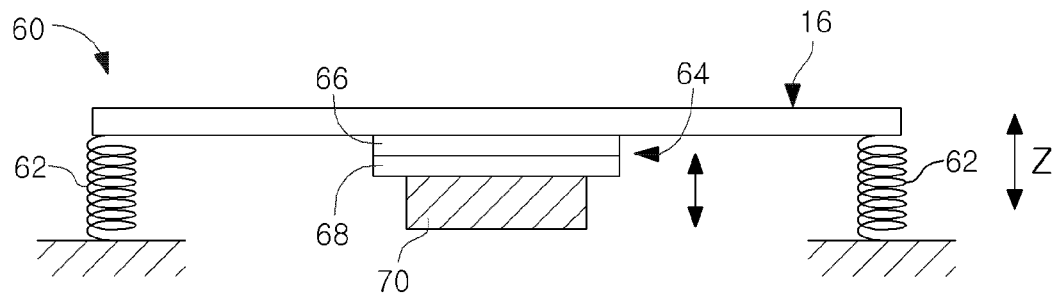
FIG. 15 is a view showing a structure of a conventional mobile terminal with a haptic feedback function.

As shown in FIG. 14, since the resonance frequency of the vibration member 230 is 200 Hz, in case that the frequency of the voltage applied to the piezoelectric element 270 is 200 Hz, the displacement is considerably increased.

INDUSTRIAL APPLICABILITY

As described above,

While the present invention has been described with respect to the specific embodiments, it will be apparent to those skilled in the art that various changes and modifications may be made without departing from the spirit and scope of the invention as defined in the following claims.

The invention claimed is:

1. A haptic module using a piezoelectric element, comprising:
    a base;
    a vibration member which is mounted to an upper portion of the base so as to be movable up and down;
    a piezoelectric element which is coupled to the vibration member;
    a power part for applying power to the piezoelectric element;
    a panel member which is mounted to an upper portion of the vibration member,
    wherein the piezoelectric element deforms the vibration member to be bent and vibrates the panel member up and down, and
    an elastic supporting part formed into a bar shape of which one end is connected with one of the base and the vibration member and the other end is connected with the other one,
    wherein the piezoelectric element is installed at the elastic supporting part so as to deform the vibration member to be bent and vibrate the panel member up and down when electric power is applied, and the elastic supporting part is formed to be inclined from one end thereof toward the other end, and in a normal state, an up and down distance between the one end of the elastic supporting part and the other end thereof is formed to be larger than an up and down distance between the vibration member and the base, thereby elastically supporting the vibration member upward.

2. The haptic module according to claim 1, wherein one end of the elastic supporting part is integrally connected with the vibration member and the other end thereof is formed to be inclined downward and settled on the upper portion of the base, and the vibration member is formed with a spacing hole which is formed to be opened up and down and which allows an outer surface of the elastic supporting part to be spaced apart from the vibration member.

3. The haptic module according to claim 2, wherein the piezoelectric element is installed at a lower side of the elastic supporting part, and
    a GND electrode is installed at an upper surface of the piezoelectric device, which is between the piezoelectric element and the elastic supporting part, and a positive (+) electrode is installed at a lower surface of the piezoelectric element, and if electric power is applied to the piezoelectric element through the GND electrode and the positive (+) electrode, the piezoelectric element is contracted or expanded in a length direction thereof, and thus the elastic supporting part is deformed to be bent upward and downward, and
    the base is formed with a groove which is formed to be opened up and down and disposed at a lower side of the elastic supporting part so that the piezoelectric element is inserted into the groove when the elastic supporting part is deformed to be bent, and
    a width of the groove is formed to be larger than a width of the piezoelectric device in a direction orthogonal to a length direction of the elastic supporting part.

4. The haptic module according to claim 1, wherein the elastic supporting part is provided in plural each of which is disposed at an outer side of the vibration member, and each elastic supporting part has the same length.

5. The haptic module according to claim 1, wherein a cushion member is formed along an outer surface of the touch pad between a mobile terminal cover and the vibration member.

6. A haptic module using a piezoelectric element, comprising:
- a base;
- a vibration member which is mounted to an upper portion of the base so as to be movable up and down;
- a piezoelectric element which is coupled to the vibration member;
- a power part for applying power to the piezoelectric element;
- a panel member which is mounted to an upper portion of the vibration member,
- wherein the piezoelectric element deforms the vibration member to be bent and vibrates the panel member up and down, and
- wherein the vibration member comprises:
- a coupling part which is coupled to the panel member;
- a first supporting part of which one end is connected with the coupling part and the other end is horizontally protruded from the coupling part; and
- a second supporting part which is horizontally protruded from the coupling part to be parallel with the first supporting part and of which a distal end is bent and fixed to the base,
- wherein the piezoelectric element is installed at the first supporting part and deforms the first supporting part to be bent and vibrates the panel member up and down, when electric power is applied.

7. The haptic module according to claim 6, wherein the second supporting part supports the coupling part and the panel member upward and downward, and comprises:
- an upper supporting part of which one end is connected to the coupling part and the other end is formed to be horizontally protruded;
- a lower supporting part which is disposed at a lower side of the upper supporting part so as to be spaced apart from the upper supporting part and of which one end is fixed to the base; and
- a bent part which is formed to be bent and of which one end is connected with the other end of the upper supporting part and the other end is connected with the other end of the lower supporting part.

8. The haptic module according to claim 6, wherein the first and second supporting parts are spaced apart from a lower surface of the panel member.

9. The haptic module according to claim 6, wherein a supporting block is protruded from the base so as to support the other end of the first supporting part, and
- the first supporting part is spaced apart from a lower surface of the base, and
- the other end of the first supporting part is contacted with the supporting block so and thus prevented from being moved down when the first supporting part is deformed to be bent by the piezoelectric element.

10. The haptic module according to claim 6, wherein each pair of the first and second supporting parts is formed at both sides of the coupling part.

11. The haptic module according to claim 6, wherein the first and second supporting parts are symmetric with respect to a center portion of the panel member.

12. The haptic module according to claim 8, wherein the panel member comprises:
- a frame of which a lower portion is coupled to the coupling part;
- a liquid crystal part which is settled on an upper portion of the frame; and
- a touch pad which is coupled to the upper portion of the frame while covering an upper surface of the frame,
- wherein a first settling groove for settling the liquid crystal part and a second settling groove for settling the touch pad are formed in an upper surface of the frame, and a spacing groove is formed at a lower portion of the frame so as to be spaced apart from the first and second supporting parts.

13. The haptic module according to claim 1, further comprising a control part for controlling the electric power applied to the piezoelectric element,
- wherein the piezoelectric element is deformed by the electric power applied by the control part so as to vibrate the vibration member and the panel member, and
- a voltage applied to the piezoelectric element has a sine wave.

14. The haptic module according to claim 13, wherein a frequency of the voltage applied to the piezoelectric element is a resonance frequency which is the same as a natural frequency of the vibration member.

15. The haptic module according to claim 13, wherein the frequency of the voltage applied to the piezoelectric element is 100 to 350 Hz.

* * * * *